United States Patent [19]

Naufel

[11] Patent Number: 5,304,855
[45] Date of Patent: Apr. 19, 1994

[54] BI-LEVEL PULSE ACCUMULATOR
[75] Inventor: Naji C. Naufel, Austin, Tex.
[73] Assignee: Motorola, Inc., Schaumburg, Ill.
[21] Appl. No.: 941,603
[22] Filed: Sep. 8, 1992
[51] Int. Cl.$^5$ .............................................. H03K 5/26
[52] U.S. Cl. ..................................... 307/265; 377/20; 328/111; 307/234
[58] Field of Search ............... 328/111, 129.1; 377/20, 377/21; 307/265, 234

[56] References Cited

U.S. PATENT DOCUMENTS

| | | | |
|---|---|---|---|
| 3,555,434 | 1/1971 | Sheen | 307/520 |
| 3,996,586 | 12/1976 | Dillon et al. | 328/111 |
| 4,511,846 | 4/1985 | Nagy et al. | 307/265 |
| 4,730,131 | 3/1988 | Sauer | 302/520 |
| 4,904,947 | 2/1990 | Olivenbaum et al. | 307/234 |
| 5,223,742 | 6/1993 | Schumacher | 328/129.1 |

OTHER PUBLICATIONS

"Microprocessor, Microcontroller and Peripheral Data"-vol. 1, published by Motorola, Inc. in 1988, pp. 3-859 through 3-898.

"HC11: M68HC11 Reference Manual" published by Motorola, Inc. in 1988, pp. 11-1 thorugh 11-12.

Primary Examiner—Timothy P. Callahan
Assistant Examiner—Dinh Le
Attorney, Agent, or Firm—Elizabeth A. Apperley

[57] ABSTRACT

A pulse accumulator (24) operates in a pulse measurement mode. In the pulse measurement mode, accumulator (24) measured pulse lengths of consecutive high and low input signal pulses in reference to a clock signal. A leading-edge capture circuit (50) asserts a leading-edge pulse to indicate a rising edge of the input signal and a trailing-edge capture circuit (52) asserts a trailing-edge pulse to indicate a falling edge of the input signal. The leading-edge and trailing-edge pulses are logically combined (70) to provide a load signal to enable counter (76) to provide an accumulate value to a buffer register (78). After a predetermined delay (62, 64), each of the leading-edge and trailing-edge pulses are logically combined (66) to provide a clear signal which indicates the input signal has transitioned and counter (76) should be cleared to begin measuring a length of a next pulse.

25 Claims, 4 Drawing Sheets

BI-LEVEL PULSE ACCUMULATOR

FIELD OF THE INVENTION

This invention relates generally to a microcontroller, and more particularly to a pulse accumulator in a microcontroller.

BACKGROUND OF THE INVENTION

In many data processing applications, signals are communicated in a pulse width modulated format. In the pulse width modulated format, information is transmitted in both high and low level pulses which have varying lengths. The length of the pulses are then translated into a more meaningful value for subsequent use.

In implementations which use a counter to measure the length of the pulses, the length of either the high or the low pulses of an input signal are measured while the pulse is asserted. For example, to determine a length of a high pulse, the counter generally begins counting the cycles of an independent clock signal on a rising edge of the input signal. Subsequently, the counter stops counting on the falling edge of the input signal. The counter then provides the count value to an external user and is reset to begin counting again on the next rising edge of the input signal. Similarly, to determine a length of a low pulse of the input signal, the counter generally begins counting the cycles of the clock signal on a falling edge of the input signal. Subsequently, the counter stops counting on the rising edge of the input signal. The counter then provides an external user with the count value and is reset to begin counting again on a next falling edge of the input signal.

Because the counter must be reset before a new count may begin, measuring of consecutive high and low pulses is not possible. If information from both high and low pulses is required, a counter measures a length of a high pulse and must then wait a full period before measuring a length of a low pulse. Therefore, whether measuring high or low pulse lengths, a user is only able to receive data from either the high or low pulses. Information contained in the other pulse type must be ignored when a counter is used to determine the length of a pulse.

When essential information is transferred on both high and low pulses, the information contained in either pulse type may not be ignored. In such applications, a timer circuit which is programmable is used to measure consecutive pulses. The timer circuit may be programmed to measure consecutive pulses of the input signal through software. However, when a timer circuit is used, the frequency of the pulses is limited by the processing time required to execute the software program. The pulses must be at least as long as the time required to execute the software program. Additionally, circuitry required to implement a timer circuit is typically much larger than the circuitry required to implement a counter. As well, the software program controlling execution of the timer circuit may require an excessive amount of memory space. An example of such a timer circuit is provided in a MC68HC05C4 microcontroller unit commercially available from Motorola, Inc. of Austin, Tex. The timer circuit in the MC68HC05C4 microcontroller unit includes a sixteen bit software-programmable counter which is driven by a clock prescaler. The timer has an output compare register and an input capture register. For more information about the MC68HC05C4 microcontroller unit, refer to "Motorola Microprocessor, Microcontroller, and Peripheral Data," Volume 1 published in 1988.

Therefore, a need exists for a system which would determine a length of consecutive high and low pulses without excessive circuit area or memory requirements. Additionally, a length of each pulse should be determined and no pulses should be ignored or missed.

SUMMARY OF THE INVENTION

The previously mentioned needs are fulfilled with the present invention. Accordingly, there is provided, in one form, a pulse accumulator for measuring a length of a plurality of pulses of an input signal. The pulse accumulator includes a clock interface for providing a clock signal. A leading edge capture circuit has a first input for receiving the input signal and a second input for receiving the clock signal. The leading edge capture circuit provides a leading edge signal to indicate a rising edge of the input signal. A trailing edge capture circuit has a first input for receiving the input signal and a second input for receiving the clock signal. The trailing edge capture circuit provides a trailing edge signal to indicate a falling edge of the input signal. The pulse accumulator also includes a first logic circuit for logically combining the leading edge signal and the trailing edge signal to provide both a load signal and a reset signal. The load signal is provided before the reset signal. A counter has both a first input coupled to the clock interface for receiving the clock signal and a second input coupled to the first logic means for receiving the reset signal. The counter accumulates a count value in response to the clock signal and is initialized to a predetermined value when the reset signal is asserted. A buffer register has both a first input coupled to the counter for receiving the count value and a second input coupled to the first logic means for receiving the load signal. The buffer register stores the count value in response to the load signal. The count value is stored in the buffer register before the counter is initialized to the predetermined value.

These and other features, and advantages, will be more clearly understood from the following detailed description taken in conjunction with the accompanying drawing.

DETAILED DESCRIPTION OF A PREFERRED EMBODIMENT

During a description of the implementation of the invention, the terms "assert" and "negate," and various grammatical forms thereof, are used to avoid confusion when dealing with a mixture of "active high" and "active low" logic signals. "Assert" is used to refer to the rendering of a logic signal or register bit into its active, or logically true, state. "Negate" is used to refer to the rendering of a logic signal or register bit into its inactive, or logically false state. Additionally, a hexadecimal value may be indicated by a "$" symbol preceding a value.

The present invention provides a bi-level pulse accumulator which measures consecutive high and low pulses of an input signal. The pulse accumulator described herein includes a counter which counts clock cycles for a period of a high pulse of the input signal. On the falling edge of the high pulse, the pulse accumulator loads the contents of the counter in a buffer register and resets the counter. Therefore, the counter is able to again begin counting from an initialized value during the low pulse. While the counter is counting during the low pulse, an external user may read the contents of the buffer register. Therefore, consecutive high and low pulses may be measured without losing any information.

In the bi-level pulse accumulator described herein, a register holds a plurality of control values which control operation of the pulse accumulator. An eight bit value must be written to the register to control operation of the pulse accumulator. However, no other software instructions are required to perform consecutive counting of high and low pulses of the input signal. Therefore, the pulse accumulator described herein performs consecutive bi-level pulse accumulator without either time consuming software program or area consuming timer circuits.

Figure 1:
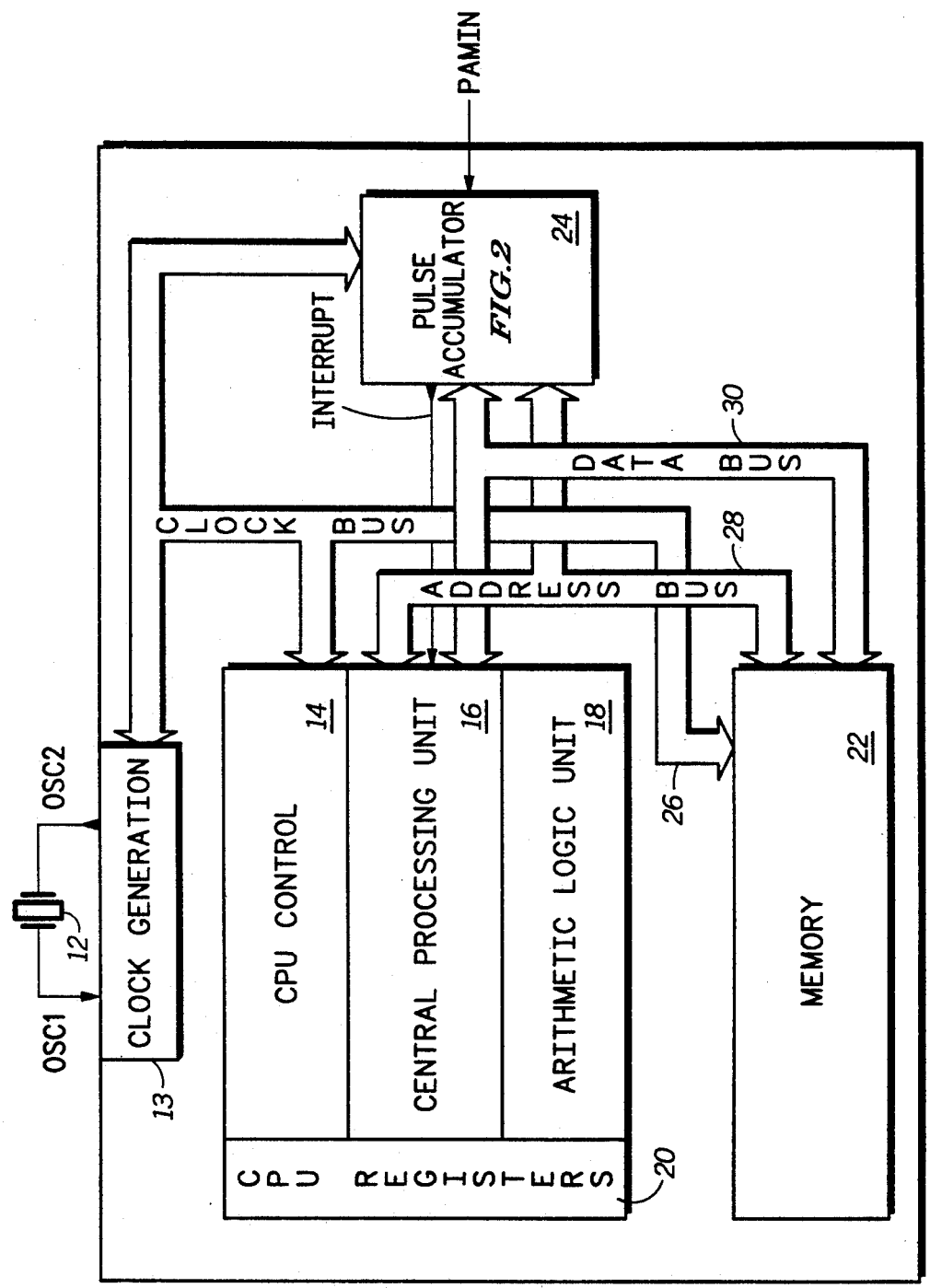
FIG. 1 illustrates in block diagram form a microcontroller having a bi-level pulse accumulator in accordance with the present invention.

One implementation of the system and method of operation described above is implemented in a modified form of a Motorola MC68HC05 microcomputer. The MC68HC05 is an eight bit microcomputer which includes eight bit addresses and storage registers and is available from Motorola, Inc. of Austin, Tex. FIG. 1 illustrates a data processing system 10 which implements one embodiment of the present invention. Data processing system 10 generally includes an external crystal oscillator 12, a clock generation circuit 13, a Central processing Unit (CPU) control circuit 14, a CPU 16, an Arithmetic Logic Unit (ALU) 18, a plurality of CPU registers 20, a memory circuit 22, and a pulse accumulator 24.

Clock generation circuit 13 provides an output labeled "OSC 2" to crystal oscillator 12. Crystal oscillator 12 provides an output labeled "OSC 1" to clock generation circuit 13. Clock generation circuit 13 provides a plurality of clock signals to each of CPU control circuit 14, CPU 16, ALU 18, CPU registers 20, memory circuit 22, and pulse accumulator 24 via a Clock Bus 26. An Address Bus 28 and a Data Bus 30 respectively provide digital address and data values from CPU 16 to each of CPU control circuit 14, ALU 18, CPU registers 20, memory circuit 22, and pulse accumulator 24. Pulse accumulator 24 receives an external signal labeled "PAMIN" from an external source. Additionally, pulse accumulator 24 provides a signal labeled "Interrupt" to CPU 16.

During operation of data processing system 10, both the OSC 1 and OSC 2 signals enable crystal oscillator 12 to oscillate at a predetermined frequency. Operation of a crystal oscillator is well known in the data processing art and should be apparent to one with ordinary skill in the art.

Clock generation circuit 13 processes the clock signal provided by the OSC1 signal to provide a plurality of clocks to each remaining portion of data processing system 10 via Clock Bus 26. Generally, clock generation circuit 13 divides the frequency of the OSC1 signal to provide a plurality of clock signals. In this embodiment of the invention, the OSC 1 signal is divided by two. Subsequently, the divided clock value may be divided by eight, sixteen, eighty, and one hundred and sixty to provide a plurality of clock signals with a wide variety of frequencies.

Address and data values are respectively provided by CPU 16 to CPU control circuit 14, ALU 18, and the plurality of CPU registers 20. CPU 16 processes each of the address and data values to enable data processing system 10 to perform one of a plurality of functions. In some functions, CPU 16 may be required to access memory 22 for an instruction or data value stored therein. Operation of each of CPU control circuit 14, CPU 16, ALU 18, the plurality of CPU registers 20, and memory circuit 22 are well known in the art and, therefore, will not be explained in further detail except in reference to the embodiment of the invention described herein.

Pulse accumulator 24 of data processing system 10 receives control information from CPU 16 via Data Bus 30. The plurality of clock signals are also provided to pulse accumulator 24 via Clock Bus 26. The PAMIN signal is provided to pulse accumulator 24 via an external source (not shown). As was previously mentioned, the PAMIN signal provides the pulses to be measured by pulse accumulator 24.

During operation, pulse accumulator 24 operates in one of two modes-a pulse counting mode or a pulse measurement mode. In the pulse counting mode, a counter within pulse accumulator 24 increments on preselected edge transitions of the PAMIN signal. In the pulse counting mode, an interrupt only occurs when the counter overflows and the Interrupt signal is asserted. Additionally, in the pulse counting mode, each pulse of the PAMIN signal must be longer than two internal clock signals.

In the pulse measurement mode, the counter is active on both phases of the PAMIN signal. A length of each phase is measured with reference to a clock signal provided by Clock Bus 26. In contrast, in the pulse counting mode, the counter is incremented on either the rising or falling edge of the PAMIN signal. In the pulse measurement mode, a value accumulated in the counter is copied into a buffer register when the PAMIN signal transitions from a high to a low pulse or a low to a high pulse. The value in the counter is then reset to a predetermined value to start accumulating a count value which is gated by an opposite phase of the PAMIN signal. Therefore, the lengths of both high and low pulses may be consecutively measured.

Figure 2:
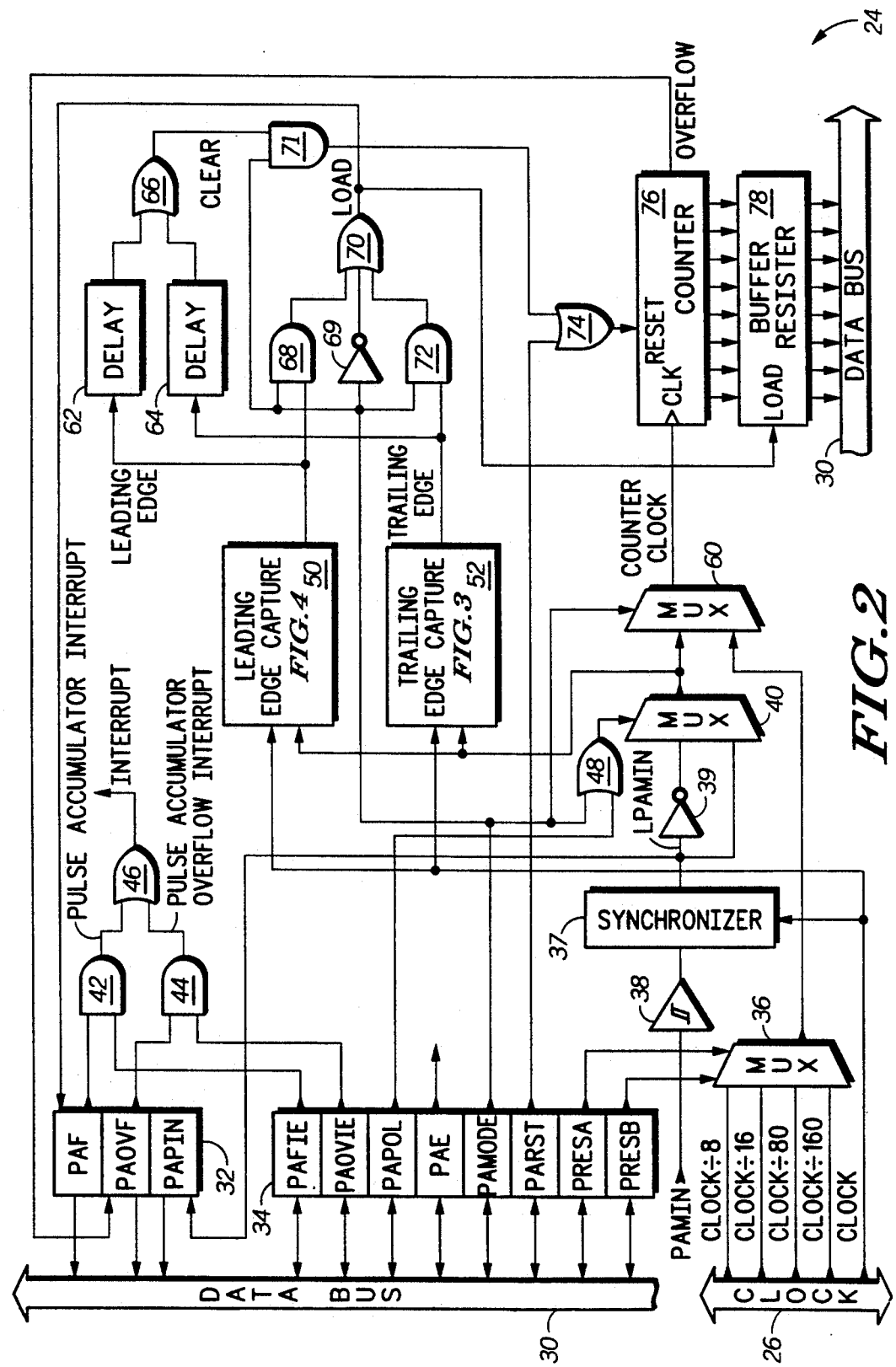
FIG. 2 illustrates in block diagram form the bi-level pulse accumulator of FIG. 1.

Pulse accumulator 24 is illustrated in greater detail in FIG. 2. Pulse accumulator generally includes a status register 32, a control register 34, a multiplexer 36, a synchronizer 37, a buffer 38, an inverter 39, a multiplexer 40, an AND gate 42, an AND gate 44, and OR gate 46, an OR gate 48, a leading edge capture circuit 50, a trailing edge capture circuit 52, a multiplexer 60, a delay circuit 62, a delay circuit 64, an OR gate 66, an AND gate 68, an inverter 69, an OR gate 70, an AND gate 71, an AND gate 72, an OR gate 74, a counter 76, and a buffer register 78. Control register 34 stores a plurality of control values which enable pulse accumulator 24 to perform any one of a plurality of functions. Similarly, a status register 32 stores status information associated with operation of pulse accumulator 24.

In pulse accumulator 24, Data Bus 30 is bi-directionally coupled to control register 34. A first output of control register 34, a signal labeled "PAFIE," is provided to a first input of AND gate 42. A second output of control register 34, a signal labeled "PAOIE," is provided to a first input of AND gate 44. A third output of control register 34 is a signal labeled "PAPOL." The PAPOL signal is provided to a first input of OR gate 48. A fourth signal provided by control register 34 is labeled "PAE." Although not shown in FIG. 2, the PAE is generally provided to each of the components included in pulse accumulator 24 to enable each to function. Generation and routing of a general enable are well known in the data processing art an will not be discussed in further detail. A fifth output of control register 34 is labeled "PAMODE." The PAMODE signal is connected to a second input of OR gate 48, a select input of multiplexer 60, a first input of AND gate 68, an input of inverter 69, a first input of AND gate 71, and a first input of AND gate 72. A sixth output of control register 34, labeled "PARST," is provided to a first input of OR gate 74. The seventh and eighth outputs of control register 34 are respectively labeled "PRESA" and "PRESB." The functions performed by each of the outputs of control register 34 will be subsequently discussed in more detail. Furthermore, in control register 34, each of the plurality of control values may be read or written via Data Bus 30.

Clock Bus 26 provides a plurality of clock signals to respective inputs of multiplexer 36. The plurality of clock signals are respectively labeled "Clock÷8", "Clock÷16," "Clock÷80," and "Clock÷160." An output of multiplexer 36 is provided to a first input of multiplexer 60. Additionally, Clock Bus 26 provides a "Clock" signal to an input of synchronizer 37. The Clock signal is also provided to each of a remaining portion of components of pulse accumulator 24. Routing of the Clock signal is well known in the data processing art, and will not be discussed in further detail.

The PAMIN signal is provided to buffer 38. An output of buffer 38 is provided to synchronizer 37. Synchronizer 37 provides a synchronized input signal labeled "LPAMIN" to an input of inverter 39, a first data input of multiplexer 40, and a first input of status register 32 labeled "PAPIN." An output of inverter 39 is provided to a second data input of multiplexer 40. An output of OR gate 48 is connected to a select input of multiplexer 40. An output of multiplexer 40 is provided to both leading edge capture circuit 50 and trailing edge capture circuit 52. Additionally, the output of multiplexer 40 is provided to a second input of multiplexer 60. An output of multiplexer 60 is labeled "Counter Clock" and is provided to a clock input of counter 76.

An output of leading edge capture circuit 50 is labeled "Leading Edge." The Leading Edge signal is provided to both a second input of AND gate 68 and an input of delay circuit 62. An output of AND gate 68 is connected to a first input of OR gate 70. An output of delay circuit 62 is connected to a first input of OR gate 66. Similarly, an output of trailing edge capture circuit 52 is labeled "Trailing Edge." The Trailing Edge signal is connected to both a second input of AND gate 72 and an input of delay circuit 64. An output of AND gate 72 is connected to a second input of OR gate 70. An output of inverter 69 is connected to a third input of OR gate 70. An output of OR gate 70 is labeled "Load." The Load signal is provided to an input of status register 32 which stores a PAF status value and a load input of buffer register 78. An output of delay circuit 64 is connected to a second input of OR gate 66. An output of OR gate 66 is provided to a second input of AND gate 71. An output of AND gate 71 is labeled "Clear." The Clear signal is provided to a second input of OR gate 74. An output of OR gate 74 is provided to a reset input of counter 76.

In this embodiment of the invention, counter 76 provides eight bits of a count value to buffer register 78. Similarly, buffer register 78 provides eight bits of the count value to Data Bus 30. Counter 76 also provides a signal labeled "Overflow" to an input of status register 32 which stores a PAOVF status value. Status register 32 provides the PAOVF status value to a second input of AND gate 44. An output of AND gate 44 is connected to a first input of OR gate 46. Similarly, status register provides the PAF status value to a second input of AND gate 42. An output of AND gate 42 is provided to a second input of OR gate 46. An output of OR gate 46 is labeled "Interrupt" and is provided directly to CPU 16 (not shown in FIG. 2).

Figure 3:
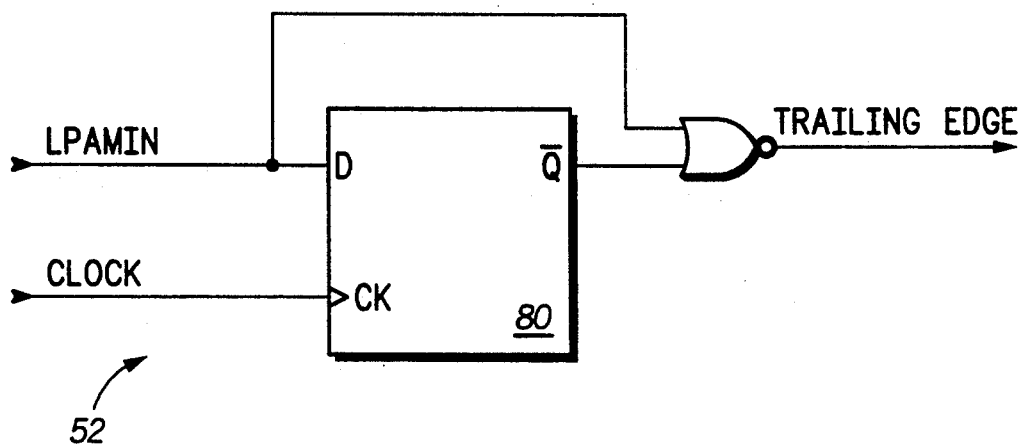
FIG. 3 illustrates in partial block form and partial logic form, a trailing edge capture circuit of FIG. 2.

Trailing edge capture circuit 52 is illustrated in greater detail in FIG. 3. Trailing edge capture circuit 52 generally includes a D flip-flop 80 and a NOR gate 82. The LPAMIN signal and the Clock signal are respectively provided to a D input and a CK (clock) input of flip-flop 80. The LPAMIN signal is also provided to a first input of NOR gate 82. A $\overline{Q}$ output of flip-flop 80 provides a second input to NOR gate 82. NOR gate 82 provides the Trailing Edge signal.

Figure 4:
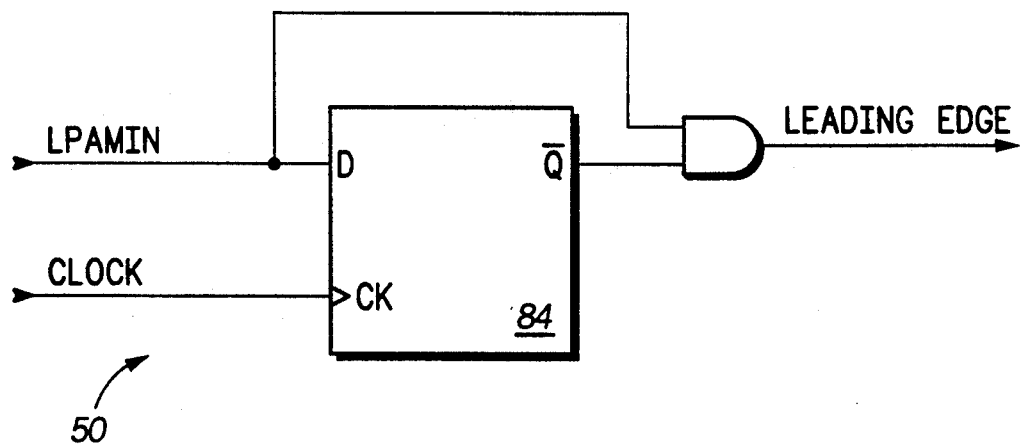
FIG. 4 illustrates in partial block form and partial logic form, a leading edge capture circuit of FIG. 2.

Similarly, leading edge capture circuit 50 is illustrated in greater detail in FIG. 4. Leading edge capture circuit 50 generally includes a D flip-flop 84 and an AND gate 86. The LPAMIN signal and the Clock signal are respectively provided to a D input and a CK (clock) input of flip-flop 84. The LPAMIN signal is also provided to a first input of AND gate 86. A $\overline{Q}$ output of flip-flop 84 provides a second input to AND gate 86. AND gate 86 provides the Leading Edge signal.

During execution of a function which involves pulse accumulator 24, CPU 16 accesses each of the plurality of control values stored in control register 34 via Data Bus 30. The first one of the plurality of control values is labeled PAFIE. The PAFIE control value indicates whether or not a pulse accumulator interrupt should be enabled or inhibited. The pulse accumulator interrupt is enabled during the pulse measurement mode of operation and is inhibited during the pulse counting mode of operation. When the PAFIE control value is asserted, the pulse accumulator interrupt is enabled. When enabled, the pulse accumulator interrupt is asserted on every edge of the PAMIN control value. Pulse accumulator 24 operates in the pulse measurement mode. When disabled, the pulse accumulator interrupt is inhibited.

The second one of the plurality of control values is labeled PAOVIE. The PAOVIE control value enables or inhibits a pulse accumulator overflow interrupt. The pulse accumulator overflow interrupt signals when a count value in counter 76 has overflowed from a hexadecimal value of $FF to a hexadecimal value of $00. When asserted, the PAOVIE control value enables the pulse accumulator overflow interrupt. Similarly, when negated, the PAOVIE control value inhibits the pulse accumulator overflow interrupt.

The third one of the plurality of control values is labeled PAPOL. The PAPOL control value indicates whether counter 76 will trigger on the rising or falling edge of the PAMIN control value during the pulse counting mode. In the pulse measurement mode, the PAPOL control value has no meaning.

The fourth one of the plurality of control values is labeled PAE. The PAE control value enables each of the components of pulse accumulator 24 to function correctly in either the pulse counting mode or the pulse measurement mode. When asserted, pulse accumulator 24 is enabled to perform either a pulse count or a pulse measurement operation. When negated, pulse accumulator 24 is disabled and clock signals to pulse accumulator 24 are inhibited. Additionally, the pulse accumulator interrupt flag and pulse accumulator overflow interrupt flag are cleared when the PAE control value is negated.

The fifth one of the plurality of control values is labeled PAMODE. The PAMODE control value enables pulse accumulator 24 to operate in either pulse measurement mode or in pulse counting mode. When the PAMODE control value is asserted, pulse accumulator 24 operates in pulse measurement mode. In the pulse measurement mode, a selected clock increments counter 76 on both high and low levels of the PAMIN input signal. When the PAMIN transitions from one state to a next, counter 76 stops counting and is reset to a hexadecimal value of $00. Counting subsequently resumes. Operation of pulse accumulator 24 in pulse measurement mode will be discussed later in more detail.

The sixth one of the plurality of control values is labeled PARST. The PARST control value resets counter 76 to a hexadecimal value of $00 when asserted.

The seventh and eighth ones of the plurality of control values are respectively labeled PRESA and PRESB. The PRESA and PRESB control values are used to select a clock signal which drives counter 76 in the pulse measurement mode. Table I illustrates a relationship between the clock frequency provided by multiplexer 60 and the PRESA and PRESB control values.

TABLE I

| PRESA | PRESB | Clock Signal |
|---|---|---|
| 0 | 0 | Clock ÷ 8 |
| 0 | 1 | Clock ÷ 16 |
| 1 | 0 | Clock ÷ 80 |
| 1 | 1 | Clock ÷ 160 |

In status register 32, a state of the pulse accumulator interrupt flag is stored as the PAF status value. The state of the pulse accumulator interrupt flag is set on every edge of the PAMIN signal in the pulse measurement mode. In the pulse counting mode, the PAF status value is inhibited from generating the Interrupt signal. The PAF status value is reset by reading status register 32 with the PAF set followed by reading buffer register 78. The PAF status value may also be reset by a hardware reset signal. The hardware reset signal is not illustrated in FIG. 2 as it is well known in the data processing art.

A state of the pulse accumulator overflow interrupt flag is stored as the PAOVF status value. The PAOVF status value is set when counter 76 rolls over from a hexadecimal value of $FF to a hexadecimal value of $00. The PAOVF status value is cleared by writing a zero to PAOVF. Like PAF, PAOVF is also cleared by a hardware reset signal.

A state of the PAMIN signal after being buffered by buffer 38 is stored in the third status value labeled "PAPIN." Like PAF and PAOVF, the PAPIN status value is stored in status register 32.

When beginning a pulse accumulation operation, assume that pulse accumulator 24 has been reset to an initialized state. CPU 16 writes a zero to each of the plurality of status values in status register 32 during a reset operation. Therefore, each of the PAF, PAOVF, and PAPIN status values has been reset to a value of zero. A subroutine necessary to execute the reset operation is generally stored in a memory, such as memory circuit 22 of FIG. 1. Upon assertion of a predetermined reset signal, the subroutine is retrieved from memory by CPU 16. CPU 16 subsequently performs each of the operations necessary to initialize data processing system 10 to begin a new operation.

During operation of pulse accumulator 24, a user must determine whether pulse accumulator 24 should operate in the pulse counting mode or the pulse measurement mode. Assume in this example that the user of data processing system 10 determines that consecutive high and low pulses of an input signal (the PAMIN signal) should be measured. Therefore, pulse accumulator 24 operates in the pulse measurement mode and the PAMODE control value is set. Additionally, the PAFIE, PAOVIE, and PAE control values are also set. As was previously mentioned, the PAPOL control value has no meaning in the pulse measurement mode and will be negated. Additionally, the PARST signal should only be asserted when the user of data processing system 10 determines that counter 76 should be initialized to a hexadecimal value of $00. Similarly, the user must determine a proper clock frequency to count a number of pulses. As was previously mentioned, the PAMIN pulse width must be longer than four internal clock signals.

The user may assert or negate each of the control values by writing an appropriate eight bit hexadecimal number to control register 34. For example, assume the user wants pulse accumulator 24 to operate in the pulse measurement mode with a clock frequency which is equal to the internal clock frequency of data processing system 10 divided by eight. The user would write a hexadecimal value of $D8 (binary value 11011000) to control register 34. Observe that the PAFIE, PAOVIE, PAE, and PAMODE control values are asserted, and the PAPOL, PARST, PRESA, and PRESB control values are negated. Writing a data value to a register is well known in the data processing art.

To begin operation, a user of data processing system 10 must write the hexadecimal value of $D8 to control register 34. Execution of the pulse measurement mode for measuring consecutive high and low pulses of the PAMIN signal subsequently begins.

Because the PRESA and PRESB signals are set to zero, multiplexer 36 selects and outputs the Clock÷8 signal. The PAMIN signal is concurrently provided to buffer 38. In this implementation of the invention, buffer 38 is a Schmidt trigger buffer which is used to respond to slow transitions of the PAMIN signal to provide a triggered PAMIN signal. Synchronizer 37 synchronizes the triggered PAMIN signal to the Clock signal. An output of synchronizer 37 is a synchronized signal referred to as the LPAMIN signal. The LPAMIN signal is asserted on a rising edge of a Clock signal pulse which immediately follows assertion of the PAMIN signal. Similarly, the LPAMIN signal is negated on a rising edge of a subsequent Clock signal pulse which immediately follows negation of the PAMIN signal.

A logic value of the LPAMIN signal is provided as the PAPIN control value of status register 32. Additionally, the LPAMIN signal is inverted by inverter 39 and provided to multiplexer 40. The LPAMIN signal is also provided to multiplexer 40. The output of OR gate 48 provides a select signal to multiplexer 40 to provide either the LPAMIN signal or the inverted LPAMIN signal.

The PAPOL control value is provided to OR gate 48. Because pulse accumulator 24 is configured to operate in the pulse measurement mode, the PAPOL control value does not affect operation. In the example described herein, the PAPOL control value provides a zero to OR gate 48. The PAMODE control value is also provide to OR gate 48. The PAMODE control value has a logic value of one because pulse accumulator is operating in the pulse measurement mode of operation. Therefore, the output of OR gate 48 is a logic one value and multiplexer 40 is enabled to provide the LPAMIN signal to leading edge capture circuit 50, trailing edge capture circuit 52, and multiplexer 60.

Multiplexer 40 provides the LPAMIN signal to the D input of flip-flop 80 and to the first input of NOR gate 82 of trailing edge capture circuit 52. When the Clock signal provided to the CK input of flip-flop 80 is asserted, flip-flop 80 provides the LPAMIN signal to the second input of NOR gate 82. NOR gate 82 negates the Trailing Edge signal.

Multiplexer 40 provides the LPAMIN signal to the D input of flip-flop 84 and to the first input of AND gate 86 of leading edge capture circuit 50. When the Clock signal provided to the CK input of flip-flop 84 is asserted, flip-flop 84 provides the LPAMIN signal to the second input of AND gate 86. AND gate 86 asserts the Leading Edge signal for one clock period.

The Leading Edge signal is provided to both delay circuit 62 and AND gate 68. AND gate 68 also receives the PAMODE control value. Again, because pulse accumulator 24 operates in the pulse measurement mode, the PAMODE control value is a logic one value. Therefore, when the Leading Edge signal is asserted, AND gate 68 provides a logic value of one to OR gate 70. OR gate 70 subsequently asserts the Load signal to indicate that buffer register 78 should load the contents of counter 76. The contents of counter 76 reflect the low pulse of the PAMIN signal which occurred prior to the current high pulse of the PAMIN signal.

While leading edge capture circuit 50 is generating a one shot Leading Edge signal, multiplexer 60 provides the CLK input to counter 76 to enable counter 76 to count. Multiplexer 60 provides the Clock÷8 signal to counter 76 as the Counter Clock signal because the PAMODE control value provided to multiplexer 60 is a logic one value. Counter 76 subsequently counts from a hexadecimal value of $00 to a hexadecimal value of $ZZ using the Counter Clock signal as a reference. Counter 76 counts until either the PARST control value or the Load signal asserts the reset input of counter 76.

When the Load signal is asserted by OR gate 70, counter 76 provides the count value accumulated during the previous low pulse of the PAMIN signal, hexadecimal value $ZZ, to buffer register 78. The count value is subsequently provided to Data Bus 30 when requested by a user of data processing system 10.

After the Load signal is asserted, delay circuit 62 delays the leading edge signal for one period of the Clock signal. Delay circuit 62 provides a delayed Leading Edge signal to OR gate 66. The output of OR gate 66 is provided to AND gate 71. Because pulse accumulator 24 is operating in the pulse measurement mode, an asserted PAMODE signal is also provided to AND gate 71. AND gate 71 subsequently asserts the Clear signal on a rising edge of the Clock signal. The Clear signal is provided to OR gate 74 which asserts the reset input of counter 76 to reset the count value to a hexadecimal value of $00.

During the high pulse of the PAMIN signal, counter 76 counts from a hexadecimal value of $00 to a hexadecimal value of "XX," where "XX" is a hexadecimal value. Counter 76 counts while the PAMIN signal is asserted. The LPAMIN signal is subsequently negated on the first rising edge of the Clock signal after the high pulse of the PAMIN signal is negated.

The LPAMIN signal is then provided to inverter 39, multiplexer 40, and status register 32. As described before, multiplexer 60 is enabled to provide the Clock÷8 signal as the Counter Clock signal to counter 76. Additionally, the LPAMIN signal is provided to each of leading edge capture circuit 50 and trailing edge capture circuit 52.

Multiplexer 40 provides the LPAMIN signal to the D input of flip-flop 84 and to the first input of AND gate 86 of leading edge capture circuit 50. The Clock signal provided to the CK input of flip-flop 84 is asserted and flip-flop 84 provides the LPAMIN signal to the second input of AND gate 86. AND gate 86 negates the Leading Edge signal as a result of both the LPAMIN input and $\overline{Q}$ output providing signals with a logic level of zero.

Similarly, multiplexer 40 provides the LPAMIN signal to the D input of flip-flop 80 and to the first input of NOR gate 82 of trailing edge capture circuit 52. When the Clock signal provided to the CK input of flip-flop 80 is asserted, flip-flop 80 provides the LPAMIN signal to the second input of NOR gate 82. NOR gate 82 asserts the Trailing Edge signal for one Clock÷8 period as a result of both the LPAMIN input and $\overline{Q}$ output providing signals with a logic level of zero.

The Trailing Edge signal is provided to both delay circuit 64 and AND gate 72. AND gate 72 also receives the PAMODE control value. Again, because pulse accumulator 24 operates in the pulse measurement mode, the PAMODE control value is a logic one value. Therefore, when the Trailing Edge signal is asserted, AND gate 72 provides a logic value of one to OR gate 70. OR gate 70 subsequently asserts the Load signal to indicate that buffer register 78 should load the contents of counter 76. The contents of counter 76 reflect the high pulse of the PAMIN signal which occurred prior the low pulse currently provided by the PAMIN signal.

While trailing edge capture circuit 52 generates a one shot Trailing Edge signal, multiplexer 60 provides the CLK input to counter 76 to enable counter 76 to count. Multiplexer 60 provides the Clock÷8 signal to counter 76 as the Counter Clock signal because the PAMODE control value provided to multiplexer 60 is a logic one value. Counter 76 subsequently counts from a hexadecimal value of $00 to a hexadecimal value of $XX using the Counter Clock signal as a reference. Counter 76 counts until either the PARST control value or the Load signal asserts the reset input of counter 76.

When the Load signal is asserted by OR gate 70, counter 76 provides the count value of the previous high pulse of the PAMIN signal, hexadecimal value $XX, to buffer register 78. The count value is subsequently provided to Data Bus 30 when requested by a user of data processing system 10.

After the Load signal is asserted, delay circuit 64 delays the Trailing Edge signal for one period of the Clock signal. Delay circuit 64 provides a delayed Trailing Edge signal to OR gate 66. OR gate 66 provides an asserted output to AND gate 71. The PAMODE signal also provides an asserted signal to AND gate 71. AND gate 71 subsequently asserts the Clear signal on a rising edge of the Trailing Edge signal. The Clear signal is provided to OR gate 74. OR gate 74 then asserts the reset input of counter 76 to reset the count value to a hexadecimal value of $00.

In addition to the counting consecutive high and low pulses of the PAMIN signal, pulse accumulator 24 also provides the Interrupt signal in response its status. The PAF status value of status register 32 is provided by the Load signal generated by OR gate 70. If the PAFIE control value of control register 34 is enabled and the Load signal is asserted, AND gate 42 provides an asserted output to OR gate 46. OR gate 46 subsequently asserts the Interrupt signal. As was previously mentioned, the Interrupt signal is provided to CPU 16 to initiate an interrupt routine.

Additionally, the PAOVF status value is provided by the Overflow signal provided by counter 76. Counter 76 provides the Overflow signal if a count value overflows from a hexadecimal value of $FF to $00. When the PAOVIE control value of control register 34 is enabled and the Overflow signal is asserted, AND gate 44 provides an asserted output to OR gate 46. OR gate 46 subsequently asserts the Interrupt signal. As was previously mentioned, the Interrupt signal is provided to CPU 16 to initiate an interrupt routine.

Figure 5:
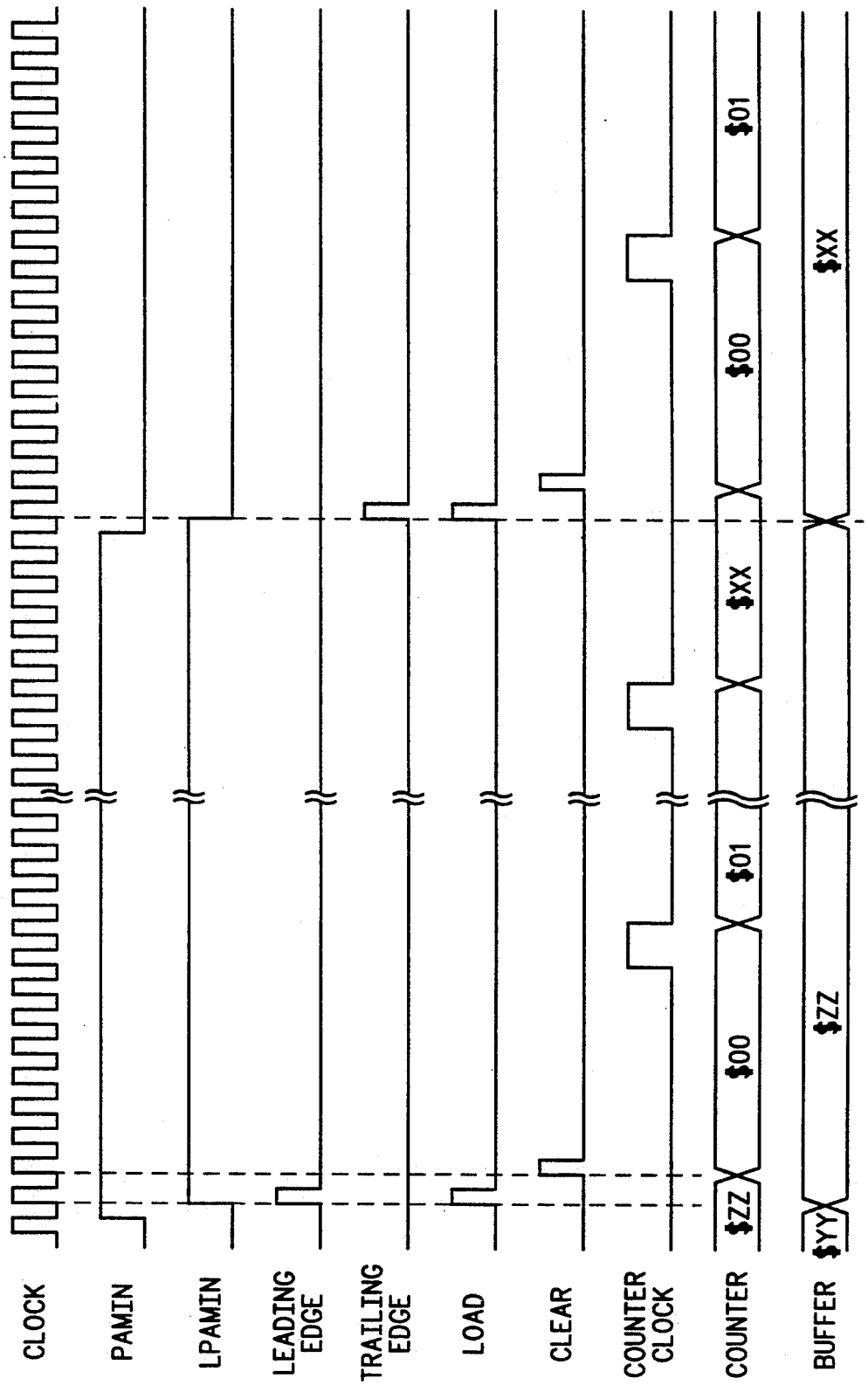
FIG. 5 illustrates in timing diagram form a timing diagram of operation of the bi-level pulse accumulator in accordance with the present invention.

A summary of the pulse measurement mode operation described above is illustrated in timing diagram form in FIG. 5. The Clock signal is shown at the top of FIG. 5. The PAMIN signal is provided by the external source previously discussed. The LPAMIN signal is asserted on the first rising edge of the Clock signal after assertion of the PAMIN signal. The LPAMIN signal is negated on the first rising edge of the Clock signal after negation of the PAMIN signal.

The Leading Edge signal is asserted when the LPAMIN signal asserted. The Leading Edge signal remains asserted for one pulse of the Clock signal and is then negated. Similarly, the Trailing Edge signal is asserted when the LPAMIN signal is negated. The Trailing Edge signal remains asserted for one pulse of the Clock signal and is then negated.

When the Leading Edge signal is asserted, the Load signal is also asserted. The Load signal is again asserted when the Trailing Edge signal is asserted. Similarly, the Clear signal is asserted after a delay of one period of the Clock signal each time the Load signal is asserted.

The Counter Clock signal provides the Clock÷8 signal to a counter which is synchronized with the Clock signal. The counter counts in accordance with the Counter Clock signal. In FIG. 5, the counter is counting to a count value of $ZZ, where $ZZ is a hexadecimal value. When the Load signal is asserted in response to the Leading Edge signal, the count value of $ZZ is provided to a buffer register. The counter is then reset to a hexadecimal value of $00 on the rising edge of the Clear signal.

Similarly, when the Load signal is asserted in response to the Trailing Edge signal, the count value of $XX is provided to the buffer register. The counter is then reset to a hexadecimal value of $00 on the rising edge of the subsequent Clear signal.

In the pulse measurement mode of operation, pulse accumulator 24 provides a unique system for performing consecutive counts of high and low pulses without a need for extensive software. A single eight bit data value must written to control register 34 to enable pulse accumulator to perform the operation described herein. Additionally, the circuit area required to implement pulse accumulator is approximately one half the circuit area required to implement a timer circuit as is described in the prior art inventions. As was previously mentioned, a typical timer circuit is the timer implemented on a Motorola MC68HC05C4.

In addition to the pulse measurement mode, pulse accumulator 24 is also able to operate in the pulse counting mode. During the pulse counting mode, pulse accumulator 24 operates as a traditional pulse accumulator circuit which counts either high or low pulses.

During the pulse counting mode, assume that a user of data processing system 10 has initialized status register 32 and written the hexadecimal value of $D3 to control register 34. Note that the PAFIE, PAOVIE, PAE, PRESA, and PRESB signals are asserted and the PAPOL, PAMODE, and PARST signal are negated. Execution of the pulse counting mode for counting pulses of the PAMIN signal subsequently begins.

The PRESA and PRESB signals are both set to one such that multiplexer 36 selects and outputs the Clock÷160 signal. As was previously described, the PAMIN signal is concurrently provided to buffer 38. Buffer 38 provides a triggered PAMIN signal to synchronizer 37. Synchronizer 37 subsequently synchronizes the PAMIN signal to the Clock signal and provides the synchronized LPAMIN signal. Again, the LPAMIN signal is asserted on a rising edge of a pulse of the Clock signal which immediately follows assertion of the PAMIN signal. Similarly, the LPAMIN signal is negated on a rising edge of a subsequent pulse of the Clock signal which immediately follows negation of the PAMIN signal.

The LPAMIN signal is inverted by inverter 39 and provided to multiplexer 40. The LPAMIN signal is also provided to multiplexer 40. The output of OR gate 48 provides a select signal to multiplexer 40 to provide either the LPAMIN signal or the inverted LPAMIN signal.

The PAPOL control value is provided to OR gate 48. Because pulse accumulator 24 is configured to operate in the pulse counting mode, the PAPOL control value determines which edge transition of the PAMIN signal will trigger counter 76 to accumulate in pulse counting mode. In the example described herein, the PAPOL control value provides a zero to OR gate 48. The PAMODE control value is also provided to OR gate 48. The PAMODE control value has a logic value of zero because pulse accumulator 24 is operating in the pulse counting mode of operation. Therefore, the output of OR gate 48 is a logic zero value and multiplexer 40 is enabled to provide the inverted LPAMIN signal to each of leading edge capture circuit 50, trailing edge capture circuit 52, and multiplexer 60.

Multiplexor 40 provides the inverted LPAMIN signal to the D input of flip-flop 84 and to the first input of AND gate 86 of leading edge capture circuit 50. When the Clock signal provided to the CK input of flip-flop 84 is asserted, flip-flop 84 provides the inverted LPAMIN signal to the second input of AND gate 86. Because the inverted LPAMIN signal is negated, the Leading Edge signal remains negated.

Multiplexer 40 provides the inverted LPAMIN signal to the D input of flip-flop 80 and to the first input of NOR gate 82 of trailing edge capture circuit 52. When the Clock signal provided to the CK input of flip-flop 80 is asserted, flip-flop 80 provides the inverted LPAMIN signal to the second input of NOR gate 82. NOR gate 82 subsequently asserts the Trailing Edge signal.

As shown in FIG. 2, the Leading Edge signal is provided to both delay circuit 62 and AND gate 68. AND gate 68 also receives the PAMODE control value. Again because pulse accumulator 24 operates in the pulse counting mode, the PAMODE control value is a logic zero value. Therefore, AND gate 68 provides a logic value of zero to OR gate 70. The PAMODE control value is also provided to AND gate 72. Therefore, AND gate 72 also provides a logic value of zero to OR gate 70. The PAMODE control value is also provided to inverter 69. Because the PAMODE control value is a logic zero value, inverter 69 provides an asserted value to OR gate 70. Therefore, OR gate 70 constantly asserts the Load signal when in the pulse counting mode of operation. Buffer register 78 is, therefore, enabled to load the contents of counter 76 continuously.

While trailing edge capture circuit 52 asserts the Trailing Edge signal, multiplexer 60 provides the CLK input to counter 76 to enable counter 76 to count. Multiplexer 60 provides the inverted LPAMIN signal to counter 76 as the Counter Clock signal because the PAMODE control value provided to multiplexer 60 is a logic zero value. Counter 76 subsequently counts each falling edge of the LPAMIN signal until the PARST control value asserts the reset input of counter 76. Additionally, in the pulse counting mode of operation, buffer register 78 is transparent and reflects the current contents of counter 76 at all times.

During the flow pulse of the LPAMIN signal, counter 76 counts from a hexadecimal value of $00 to an unknown hexadecimal value. Counter 76 counts while the LPAMIN signal is negated. The LPAMIN signal is asserted on the first rising edge of the Clock signal after a high pulse of the PAMIN signal is asserted.

Delay circuit 64 delays the Trailing Edge signal for one period of the Clock signal. Delay circuit 64 provides a delayed Trailing Edge signal to OR gate 66. OR gate 66 subsequently asserts the Clear signal on a rising edge of the Clock signal. The Clear signal is provided to OR gate 74. OR gate 74 then asserts the reset input of counter 76 to reset the count value to a hexadecimal value of $00.

In the pulse counting mode of operation, pulse accumulator 24 provides a system for counting either high or low pulses of an input signal, additionally, pulse accumulator 24 is able to provide count values in both the pulse measurement mode and the pulse counting mode with less circuitry that is typically required for a timer circuit which implements similar operations. Additionally, pulse accumulator 24 does not require extensive software as is generally required for timer circuits. A single instruction to load control register 34 is all that is needed to control operation of pulse accumulator 24 in both the pulse measurement mode and in the pulse counting mode of operation.

The implementation of the invention described herein is provided by way of example only, however, and many other implementations may exist for executing the function described herein. For example, the contents of both control register 34 and status register 32 may be modified to include more or less respective control and status values. Similarly, counter 76 may accumulate more than eight bits of digital data. Additionally, counter 76 may be implemented as a standard counter circuit which best serves the needs of the user of data processing system 10. Flip-flops 80 and 84 are also implemented as D flip-flops having standard circuitry.

While there have been described herein the principles of the invention, it is to be clearly understood to those skilled in the art that this description is made only by way of example and not as a limitation to the scope of the invention. Accordingly, it is intended, by the appended claims, to cover all modifications of the invention which fall within the true spirit and scope of the invention.

I claim:

1. A pulse accumulator for measuring a length of a plurality of pulses of an input signal, comprising:
   a clock interface for providing a clock signal;
   a leading edge capture circuit having a first input for receiving the input signal and a second input for receiving the clock signal, the leading edge capture circuit providing a leading edge signal to indicate a rising edge of the input signal;
   a trailing edge capture circuit having a first input for receiving the input signal and a second input for receiving the clock signal, the trailing edge capture circuit providing a trailing edge signal to indicate a falling edge of the input signal;
   first logic means for logically combining the leading edge signal and the trailing edge signal to provide both a load signal and a reset signal, wherein the load signal is provided before the reset signal;
   a counter having both a first input coupled to the clock interface for receiving the clock signal and a second input coupled to the first logic means for receiving the reset signal, the counter accumulating a count value in response to the clock signal, the counter being initialized to a predetermined value when the reset signal is asserted; and
   a buffer register having both a first input coupled to the counter for receiving the count value and a second input coupled to the first logic means for receiving the load signal, the buffer register storing the count value in response to the load signal, the count value being stored in the buffer register before the counter is initialized to the predetermined value.

2. The pulse accumulator of claim 1 wherein the first logic means further comprises a delay circuit for delaying the reset signal, such that the load signal is provided before the reset signal.

3. The pulse accumulator of claim 1 wherein the leading edge capture circuit is comprised of:
   a latch circuit having a first input for receiving the input signal and a second input for receiving the clock signal, the latch circuit providing a latched output; and
   a logic gate for logically combining the latched output and the input signal to provide the leading edge signal to indicate the rising edge of the input signal.

4. The pulse accumulator of claim 1 wherein the trailing edge capture circuit is comprised of:
   a latch circuit having a first input for receiving the input signal and a second input for receiving the clock signal, the latch circuit providing a latched output; and a logic gate for logically combining the latched output and the input signal to provide the trailing edge signal to indicate the falling edge of the input signal.

5. The pulse accumulator of claim 1 wherein the clock interface is a multiplexor which selectively provides the clock signal at one of a plurality of clock frequencies.

6. The pulse accumulator of claim 1 further comprising:
   a buffer having a first input for receiving the input signal, the buffer providing a buffered output signal; and
   a synchronizer having a first input for receiving the buffered output signal and a second input for receiving the clock signal, the synchronizer synchronizing the buffered output signal to the clock signal, the synchronizer providing a synchronized output signal to the first input of each of the leading edge capture circuit and the trailing edge capture circuit.

7. The pulse accumulator of claim 1 wherein the counter provides an overflow signal to indicate that a bit length of the count value has exceeded the bit length of the counter.

8. The pulse accumulator of claim 7 further comprising:
   a status register for storing a plurality of status flags and the overflow signal, the status register being coupled to the counter for receiving the overflow signal; and
   an interrupt logic circuit coupled to the status register for receiving the plurality of status flags and the overflow signal, the interrupt logic circuit asserting an interrupt signal in response both to at least one of the plurality of status flags and to the overflow signal.

9. The pulse accumulator of claim 1 further comprising a control register coupled to each of the clock interface, the leading edge capture circuit, the trailing edge capture circuit, the first logic means, the counter, and the buffer register for providing at least one control signal to enable the pulse accumulator to measure the length of the plurality of pulses of the input signal.

10. A pulse accumulator, comprising:
    a clock interface;
    an input interface;
    a first latch having a first input coupled to an output of the clock interface and a second input coupled to an output of the input interface;
    a second latch having a first input coupled to the output of the clock interface and a second input coupled to the output of the input interface;
    a first logic circuit having a first input coupled to an output of the first latch circuit and a second input coupled to an output of the second latch circuit;
    a counter having a first input coupled to the output of the clock interface and a second input coupled to a first output of the first logic circuit;
    a buffer register having a first input coupled to a first output of the counter and a second input coupled to a second output of the first logic circuit,
    a status register having a first input coupled to the output of the input interface, a second input coupled to the second output of the first logic circuit, and a third input coupled to a second output of the counter; and
    a second logic circuit having a first input coupled to a first output of the status register and a second input coupled to a second output of the status register.

11. The pulse accumulator of claim 10 wherein the first logic circuit is comprised of:
    a first delay circuit having an input coupled to the output of the first latch;
    a second delay circuit having an input coupled to the output of the second latch;
    a first OR logic gate having a first input coupled to an output of the first delay circuit and a second input coupled to an output of the second delay circuit; and
    a second OR logic gate having a first input coupled to the output of the first latch and a second input coupled to the output of the second latch.

12. The pulse accumulator of claim 10 wherein the input interface further comprises:
    a buffer having a first input for receiving the input signal, the buffer having an output; and
    a synchronizer having a first input coupled to the output of the buffer and a second input coupled to the clock interface, the synchronizer having an output coupled to the first latch and the second latch.

13. The pulse accumulator of claim 10 wherein the clock interface comprises:
    a first multiplexor; and
    a second multiplexor having a first input coupled to the input interface and a second input coupled to an output of the first multiplexor.

14. A method for measuring a length of a plurality of pulses of an input signal, comprising the steps of:
    providing a clock signal;
    providing a leading edge signal to indicate a rising edge of the input signal;
    providing a trailing edge signal to indicate a falling edge of the input signal;
    logically combining the leading edge signal and the trailing edge signal to provide a load signal;
    logically combining the leading edge signal and the trailing edge signal to provide a reset signal, wherein the reset signal is provided after the load signal;
    counting a number of clock signal pulses during a first phase of the input signal;
    storing the number of clock signal pulses accumulated during the first phase of the input signal when the load signal is asserted;
    initializing the number of clock signal pulses to a predetermined number when the reset signal is asserted;
    counting a number of clock signal pulses during a second phase of the input signal;
    storing the number of clock signal pulses accumulated during the second phase of the input signal when the load signal is asserted; and
    initializing the number of clock signal pulses to a predetermined number when the reset signal is asserted.

15. The method of claim 14 further comprising the step of:
    synchronizing the input signal to the clock signal.

16. The method of claim 14 further comprising the step of:

providing an overflow signal to indicate when a bit length of the number of clock signal pulses has exceeded a predetermined bit length.

17. The method of claim 16 further comprising the steps of:

storing a plurality of status flags; and providing an interrupt signal in response both to at least one of the plurality of status flags and to the overflow signal.

18. A pulse accumulator for performing a pulse accumulation operation using an input signal with a plurality of pulses, comprising:

a clock interface for providing a clock signal;

a control register for providing a mode control value, the mode control value indicating a mode of operation of the pulse accumulator;

a first multiplexor having a first input coupled to the clock interface for receiving the clock signal, the first multiplexor having a second input for receiving the input signal, the first multiplexor having a selector input coupled to the control register for receiving the mode control value, the multiplexor providing either the clock signal or the input signal as a counter clock signal in response to the mode control value;

a leading edge capture circuit having a first input for receiving the input signal and a second input for receiving the clock signal, the leading edge capture circuit providing a leading edge signal to indicate a rising edge of the input signal;

a trailing edge capture circuit having a first input for receiving the input signal and a second input for receiving the clock signal, the trailing edge capture circuit providing a trailing edge signal to indicate a falling edge of the input signal;

first logic means for logically combining the leading edge signal and the trailing edge signal to provide both a load signal and a reset signal, wherein the load signal is provided before the reset signal;

a counter having both a first input coupled to the first multiplexor for receiving the counter clock signal and a second input coupled to the first logic means for receiving the reset signal, the counter accumulating a count value in response to the counter clock signal, the counter being initialized to a predetermined value when the reset signal is asserted; and a buffer register having both a first input coupled to the counter for receiving the count value and a second input coupled to the first logic means for receiving the load signal, the buffer register storing the count value in response to the load signal, the count value being stored in the buffer register before the counter is initialized to the predetermined value.

19. The pulse accumulator of claim 18 wherein the clock interface is comprised of a multiplexor, the multiplexor having a plurality of inputs wherein each of the plurality of inputs receives one of a plurality of input clock signals, the multiplexor also having a select input coupled to the control register for receiving a clock frequency selector value, the multiplexor providing the clock signal in response to the clock frequency selector value.

20. The pulse accumulator of claim 18 wherein the mode of operation of the pulse accumulator is either a pulse measurement mode or a pulse counting mode.

21. The pulse accumulator of claim 18 wherein the leading edge capture circuit is comprised of:

a latch circuit having a first input for receiving the input signal and a second input for receiving the clock signal, the latch circuit providing a latched output; and a logic gate for logically combining the latched output and the input signal to provide the leading edge signal to indicate the rising edge of the input signal.

22. The pulse accumulator of claim 18 wherein the trailing edge capture circuit is comprised of:

a latch circuit having a first input for receiving the input signal and a second input for receiving the clock signal, the latch circuit providing a latched output; and a logic gate for logically combining the latched output and the input signal to provide the trailing edge signal to indicate the falling edge of the input signal.

23. The pulse accumulator of claim 18 further comprising:

a buffer having a first input for receiving the input signal, the buffer providing a buffered input signal; and a synchronizer having a first input for receiving the buffered input signal and a second input for receiving the clock signal, the synchronizer synchronizing the buffered input signal to the clock signal, the synchronizer providing a synchronized input signal to the first input of each of the leading edge capture circuit and the trailing edge capture circuit.

24. The pulse accumulator of claim 18 wherein the counter provides an overflow signal to indicate that a bit length of the count value has exceeded the bit length of the counter.

25. The pulse accumulator of claim 24 further comprising:

a status register for storing a plurality of status flags; and an interrupt logic circuit coupled to the status register for receiving the plurality of status flags, the interrupt logic circuit also coupled to the counter for receiving the overflow signal, the interrupt logic circuit asserting an interrupt signal in response both to at least one of the plurality of status flags and to the overflow signal.

* * * * *